United States Patent [19]
Mashiko et al.

[11] Patent Number: 5,781,062
[45] Date of Patent: Jul. 14, 1998

[54] SEMICONDUCTOR INTEGRATED CIRCUIT

[75] Inventors: Koichiro Mashiko; Kimio Ueda; Hiroaki Suzuki; Hiroyuki Morinaka, all of Tokyo, Japan

[73] Assignee: Mitsubishi Denki Kabushiki Kaisha, Tokyo, Japan

[21] Appl. No.: 582,416

[22] Filed: Jan. 3, 1996

[30] Foreign Application Priority Data

Aug. 21, 1995 [JP] Japan ................. 7-211772

[51] Int. Cl.$^6$ ........................... G05F 1/10
[52] U.S. Cl. ................. 327/544; 329/546; 329/215
[58] Field of Search ............... 327/77, 87, 198, 327/530, 538, 540, 541, 543, 545, 544, 546, 199, 215, 217; 365/222

[56] References Cited

PUBLICATIONS

Denshi Gijutsu, pp. 29–32, Junzo Yamada, et al., "1v Low-Power High-Speed Operation MTCMOS Logical Circuit Technology" Sep. 1994.

Primary Examiner—Timothy P. Callahan
Assistant Examiner—Jung Ho Kim
Attorney, Agent, or Firm—Oblon, Spivak, McClelland, Maier & Neustadt, P.C.

[57] ABSTRACT

A logic circuit ($L_i$) is connected between a virtual power supply line (VDDV) connected to an actual power supply (VDD) through a PMOS transistor (Q1) and a virtual grounding line (GNDV) connected to an actual ground (GND) through an NMOS transistor (Q2). During an active period, the transistors (Q1, Q2) are constantly conducting, and the virtual power supply line (VDDV) and virtual grounding line (GNDV) are at the power supply potential (VDD) and ground potential (GND), respectively. During a standby period, the transistors (Q1, Q2) periodically repeat conduction/non-conduction to charge and discharge the virtual power supply line (VDDV) and virtual grounding line (GNDV), suppressing power consumption while preventing loss of information held by the logic circuit ($L_i$).

22 Claims, 8 Drawing Sheets

SEMICONDUCTOR INTEGRATED CIRCUIT

BACKGROUND OF THE INVENTION

1. Field of the Invention

The present invention relates to a semiconductor integrated circuit and, more particularly, to a semiconductor integrated circuit intended for reduction in leakage current during standby by electrically disconnecting a power supply line and a grounding line from a logic circuit portion, without loss of logic stored in a sequential circuit such as a latch circuit and a register circuit of the logic circuit portion over a prolonged standby period.

2. Description of the Background Art

Recent advances in integration level and performance of semiconductor integrated circuits and wide expansion of the application fields thereof have presented a major technical consideration of how to reduce power consumption of the semiconductor integrated circuits or semiconductor chip bodies. The reduction in power consumption of the semiconductor integrated circuit as well as the increase in performance has become an important technical factor that adds high values to the semiconductor integrated circuits because of the requirement to increase built-in battery life for a portable information equipment into which a telephone, an electronic notebook and a miniature personal computer are integrated, because of the requirement to reduce the size of a cooling device and a power supply device for a high-performance information processing equipment, and because of the social requirement for global environmental protection by effective use of energy resources.

One of the most effective approaches to reduce the power consumption of a semiconductor device is to decrease the voltage required to operate the semiconductor device, as will be described below. The power consumption of a CMOS (complementary metal-oxide-semiconductor) LSI (large scale integration) circuit is determined by:

$$P = Idc \cdot VDD + C_T f \cdot VDD^2$$

where Idc is a DC component, $C_T$ is a total capacitance in the LSI circuit, f is an average operating frequency, and VDD is a power supply voltage.

Another approach having been proposed is an architecture designed, for example, to pause the operation of a circuit block, which is not required for some information processing, during the information processing to effectively decrease the values $C_T$ and f, thereby decreasing a current I. Unfortunately, the values $C_T$ and f in the above described equation are expected to keep increasing in the future because of the latest overall tendency toward advances in integration level and performance of the semiconductor integrated circuits.

On the other hand, there is a great likelihood that the power supply voltage VDD is decreased as technology advances, and approximately squared power supply voltage VDD has an effect on the power consumption. Thus, the power supply voltage VDD greatly influences the power consumption. Therefore, the development of low-voltage circuits is now in increasing demand to such an extent that the reduction in power consumption is equal to the reduction in voltage.

For example, when a semiconductor device with a power supply voltage of 5 V is operated at 1.5 V, the power consumption is reduced to approximately one-tenth (more specifically, $|1.5/5.0|^2$).

Unwanted secondary effects which follow the reduction in power supply voltage are the reduction in transistor's ability to feed current and the resultant reduction in operating speed, as will be described below.

To ensure a normal circuit operation, the difference between on-state current and off-state current of a transistor must be about seven orders of magnitude. To ensure the difference, a threshold voltage Vth must not be indiscriminately reduced. For example, the leakage current (current flowing when a transistor is off) of a typical existing transistor increases by more than one order of magnitude when the threshold voltage Vth is decreased by 0.1 V. For this reason, the reduction in threshold voltage Vth causes a sharp rise in current during standby (referred to hereinafter as standby current), resulting in great decrease in battery life of the portable information equipment.

In this manner, the reduction in power supply voltage VDD does not correspondingly decrease the threshold voltage Vth because of the need to suppress the standby current. Since the current feeding ability is proportional to (VDD−Vth)$^2$, the reduction in power supply voltage VDD decreases the value (VDD−Vth)$^2$, resulting in decreases in current driving ability of the transistor and in circuit operation speed.

In the background art, suppressing the power consumption by decreasing the power supply voltage makes it quite difficult to avoid the decrease in operation speed.

To solve the problem, a semiconductor device using a plurality of threshold voltages, or a so-called multi-threshold CMOS (referred to hereinafter as a MTCMOS), has been proposed. Such technique is disclosed in "Electronic Engineering, The Nikkan Kogyo Shimbun Ltd., September 1994, pp.29–32".

Figure 9:
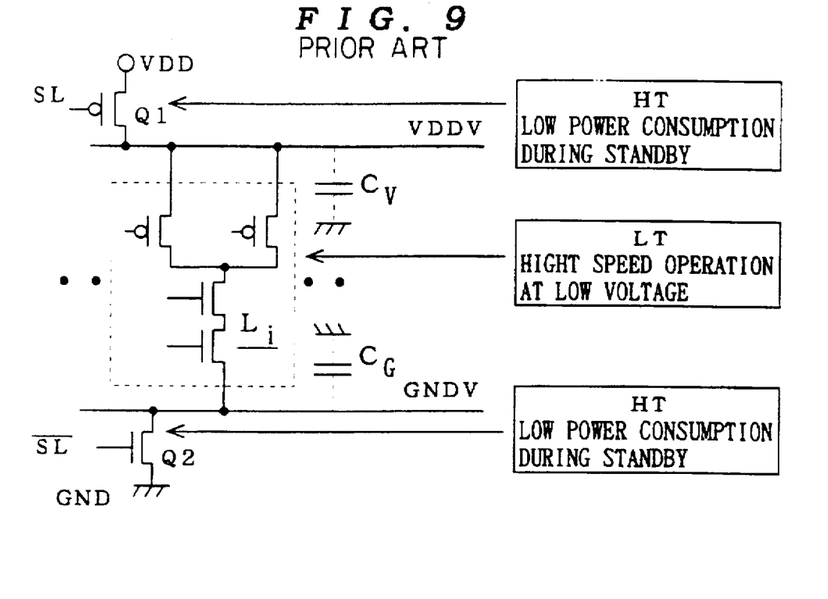
FIG. 9 is a conceptual circuit diagram of an MTCMOS circuit.

FIG. 9 is a conceptual circuit diagram of the MTCMOS circuit. The MTCMOS circuit comprises two types of CMOS transistors: high threshold transistors HT and low threshold transistors LT.

The high threshold transistor HT is a transistor for use in a general process. The low threshold transistor LT has a threshold voltage Vth set at 0.2 to 0.3 V which prevents a normally-on condition (the condition in which the transistor is not off when the gate voltage is zero) in the case of variations resulting from fabrication steps.

In such a case, the leakage current of the transistor LT is more than 1000 times that of the transistor HT. The circuit comprised of only the transistors LT causes seriously increasing standby current. The MTCMOS circuit is designed to suppress the increase in standby current.

A plurality of logic circuits $L_i$ (i=1, 2, ...) are connected to a virtual power supply line VDDV and a virtual grounding line GNDV. The virtual power supply line VDDV is connected to an actual power supply VDD through a PMOS transistor Q1 which is the high threshold transistor HT. Likewise, the virtual grounding line GNDV is connected to an actual ground GND through an NMOS transistor Q2 which is the high threshold transistor HT.

A signal SL is applied to the gate of the transistor Q1 whereas the inverted signal $\overline{SL}$ is applied to the gate of the transistor Q2.

Figure 10:
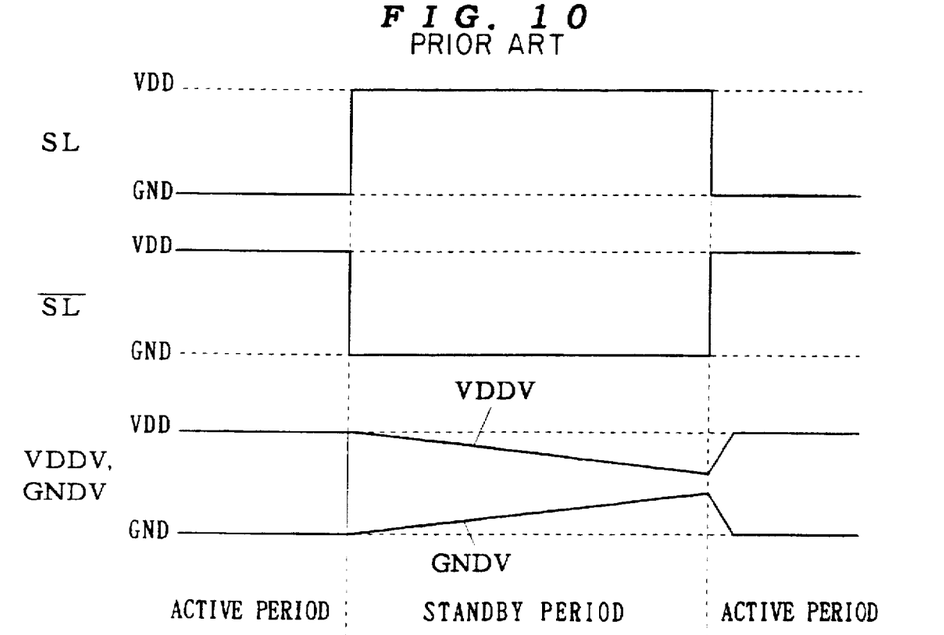
FIG. 10 is a waveform chart illustrating operation of the MTCMOS circuit.

FIG. 10 is a waveform chart illustrating the operation of the MTCMOS circuit of FIG. 9. During an active period, the signal SL is at the ground potential GND (the same reference character is used to represent the ground GND and the ground potential GND) and the signal $\overline{SL}$ is at the power supply potential VDD (likewise, the same reference character is used to represent the power supply VDD and the power supply potential VDD).

During the active period, the PMOS transistor Q1 and NMOS transistor Q2 are on, and the virtual power supply line VDDV and virtual grounding line GNDV are connected to the power supply VDD and ground GND, respectively. Thus, the virtual power supply line VDDV, the virtual grounding line GNDV, and the logic circuits $L_i$ receive current through a low-resistance current path, permitting high-speed operation when the power supply voltage is low.

During a standby period, the signal SL is at the power supply potential VDD and the signal $\overline{SL}$ is at the ground potential GND. Then, the transistors Q1 and Q2 are both off. The power supply VDD and ground GND are electrically disconnected from the logic circuits $L_i$ comprised of the transistors LT, and the leak current of the whole circuit is generated only in the transistors Q1 and Q2 which are the transistors HT. Since the transistor LT consumes more power as above described, the MTCMOS circuit may reduce a greater amount of power consumption during standby than the circuit comprised of only the transistors LT.

The conventional semiconductor device intended for low voltage operation is constructed as above described. During the standby period, the virtual power supply line VDDV and virtual grounding line GNDV are electrically disconnected from the actual power supply VDD and actual ground GND, respectively, into a high impedance state.

Over a prolonged standby period, current leaks from the virtual power supply line VDDV and virtual grounding line GNDV through the transistors LT forming the logic circuits $L_i$. The above stated large leakage current of the transistors LT causes the potentials of the virtual power supply line VDDV and virtual grounding line GNDV to approach each other with time.

In this case, there is a particularly increasing danger that a sequential circuit (including a memory circuit) for storing logic therein, such as a register circuit, a latch circuit, and a flip-flop circuit, included in the logic circuits $L_i$ may no longer hold the logic thereof to lose the information stored therein. This causes the semiconductor device not to be returned to the original state when the standby period is changed to the active period, resulting in considerable inconvenience for practical use.

SUMMARY OF THE INVENTION

According to a first aspect of the present invention, a semiconductor integrated circuit comprises a first power supply, a first power supply line for functioning to hold electrical charge, a first switch having a first end connected to the first power supply, and a second end connected to the first power supply line, and at least one logic circuit including a sequential circuit connected to the second end of the first switch through the first power supply line, wherein the first switch is constantly conducting during a first period over which the logic circuit is active, and the first switch is intermittently conducting during a second period over which the logic circuit is on standby.

Preferably, according to a second aspect of the present invention, the at least one logic circuit includes a plurality of logic circuits.

Preferably, according to a third aspect of the present invention, the semiconductor integrated circuit further comprises a timer for generating a control signal for controlling conduction of the first switch during the second period.

Preferably, according to a fourth aspect of the present invention, the semiconductor integrated circuit further comprises a potential detector circuit for detecting a first potential which is the potential of the first power supply line, the potential detector circuit bringing the first switch into conduction when the first potential falls outside a predetermined range during the second period.

Preferably, according to a fifth aspect of the present invention, the semiconductor integrated circuit further comprises a second power supply, a second power supply line for functioning to hold electrical charge, a second switch having a first end connected to the second power supply, and a second end connected to the second power supply line, and the sequential circuit being connected to the second end of the second switch through the second power supply line, wherein conduction/non-conduction of the second switch coincides with conduction/non-conduction of the first switch.

Preferably, according to a sixth aspect of the present invention, the logic circuit further includes a combinational circuit, the semiconductor integrated circuit further comprises a second switch having a first end connected to the first power supply, and a second end connected to the combinational circuit, and the second switch is constantly conducting during the first period, and the second switch is constantly non-conducting during the second period.

Preferably, according to a seventh aspect of the present invention, the semiconductor integrated circuit further comprises a second power supply, a second power supply line for functioning to hold electrical charge, a third switch having a first end connected to the second power supply, and a second end connected to the second power supply line, a fourth switch having a first end connected to the second power supply, and a second end, the sequential circuit being connected to the second end of the third switch through the second power supply line, and the combinational circuit being further connected to the second end of the fourth switch, wherein conduction/non-conduction of the third switch coincides with conduction/non-conduction of the first switch, and wherein conduction/non-conduction of the fourth switch coincides with conduction/non-conduction of the second switch.

According to an eighth aspect of the present invention, a semiconductor integrated circuit comprises a power supply for providing a predetermined potential, a power supply line for functioning to hold electrical charge, and a logic circuit including a sequential circuit, the sequential circuit being constantly connected to the power supply through the power supply line during a first period, the sequential circuit being intermittently connected to the power supply through the power supply line during a second period.

Preferably, according to a ninth aspect of the present invention, the logic circuit further includes a combinational circuit, the combinational circuit being constantly connected to the power supply during the first period, the combinational circuit being constantly disconnected from the power supply during the second period.

The semiconductor integrated circuit according to the first aspect of the present invention is not required to drive the logic circuit during the second period but must hold the state generated during the first period previous to the second period so as to prevent malfunction of the sequential circuit of the logic circuit during the first period subsequent to the second period. Since the first power supply is intermittently connected to the sequential circuit during the second period, power consumption is suppressed and the state of the sequential circuit is held by the application of electrical charge to the first power supply line.

In the semiconductor integrated circuit according to the second aspect of the present invention, when the plurality of logic circuits are on standby, the electrical charge which prevents malfunction of all logic circuits may be applied to the first power supply line only by actuating the first switch.

In the semiconductor integrated circuit according to the third aspect of the present invention, the first switch may be automatically intermittently brought into conduction during the second period.

In the semiconductor integrated circuit according to the fourth aspect of the present invention, the electrical charge sufficient for the sequential circuit to hold the state for the first period may be constantly present on the first power supply line during the second period.

In the semiconductor integrated circuit according to the fifth and seventh aspects of the present invention, the second power supply is intermittently connected to the sequential circuit. Thus, power consumption is suppressed and the state of the sequential circuit is held by the application of electrical charge to the second power supply line.

In the semiconductor integrated circuit according to the sixth aspect of the present invention, the combinational circuit whose output is determined only by the state of the currently applied signal need not hold the signal state for the first period previous to the second period during the second period and need not be provided with electrical charge. The semiconductor integrated circuit is not required to en sure electrical charge for the logic circuit indiscriminately during, the second period and does not apply electrical charge to the combinational circuit, thereby further suppressing power consumption.

In the semiconductor integrated circuit according to the eighth aspect of the present invention, the logic circuit is driven to be active during the first period. The logic circuit is on standby and need not be driven during the second period, but must hold the state generated during the first period previous to the second period so as to prevent malfunction of the sequential circuit during the first period subsequent to the second period. The power supply is intermittently connected to the power supply line during the second period so that the electrical charge which allows the retention of the state of the sequential circuit may present on the power supply line, thereby suppressing power consumption.

In the semiconductor integrated circuit according to the ninth aspect of the present invention, the combinational circuit whose output is determined only by the state of the currently applied signal need not hold the state for the first period previous to the second period during the second period. Thus, it is not necessary to previously apply electrical charge to the combinational circuit in the logic circuit which is on standby during the second period. The semiconductor integrated circuit is not required to ensure electrical charge for the logic circuit indiscriminately during the second period and does not apply electrical charge to the combinational circuit, thereby further suppressing power consumption.

The present invention has been made to solve the problem of a sequential circuit which no longer returns to the original state during an active period after a prolonged standby period. It is therefore an object of the present invention to provide a semiconductor device which operates at high speeds at a low voltage during an active period and which suppresses a leakage current during a standby period as well as achieving a reliable operation during the subsequent active period.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a block diagram of an embodiment of the present invention supporting a circuit having combinatorial and sequential circuit elements.

DESCRIPTION OF THE PREFERRED EMBODIMENTS

First Preferred Embodiment

Figure 1:
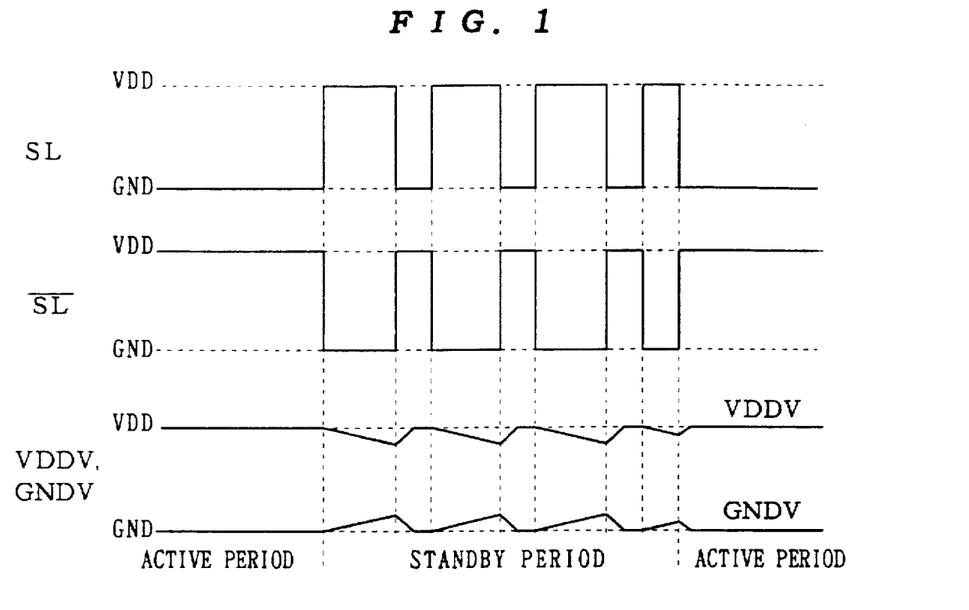
FIG. 1 is a waveform chart illustrating operation timing of a first preferred embodiment according to the present invention.

FIG. 1 is a waveform chart illustrating operation timing of a first preferred embodiment according to the present invention. The first preferred embodiment is applied to the MTCMOS circuit shown in FIG. 9, that is, to the MTCMOS circuit which comprises a power supply VDD providing a power supply potential VDD, a ground GND providing a ground potential GND, a virtual power supply line VDDV, a virtual grounding line GNDV, a high threshold PMOS transistor Q1 having a source connected to the power supply VDD and a drain connected to the virtual power supply line VDDV, a high threshold NMOS transistor Q2 having a source connected to the ground GND and a drain connected to the virtual grounding line GNDV, and a plurality of logic circuits $L_i$ (i=1, 2, ...) connected to the drain of the PMOS transistor Q1 through the virtual power supply line VDDV and connected to the drain of the NMOS transistor Q2 through the virtual grounding line GNDV. The logic circuits $L_i$ are formed by low threshold transistors LT.

Each of the logic circuits $L_i$ includes a sequential circuit which needs previous logic to determine present logic. The virtual power supply line VDDV has a capacitor $C_V$ parasitic thereon, and the virtual grounding line GNDV has a capacitor $C_G$ parasitic thereon. FIG. 11 is a block diagram of the present invention illustrating a logic circuit Li including combinatorial and sequential logic.

An active period is a period over which the logic circuits $L_i$ must practically perform logic processing, and a standby period is a period over which the logic circuits $L_i$ need not perform logic processing. A system for driving a semiconductor integrated circuit including the MTCMOS circuit determines the operating conditions (for example, a key entry wait time of a personal computer, a wait state of a portable telephone, and the like) of the system to accordingly apply a control signal to the semiconductor integrated circuit, thereby determining which one of the active and standby periods is set. Signals SL and $\overline{SL}$ are produced in the semiconductor integrated circuit in response to the control signal. During the standby period, the transistors Q1 and Q2 are off to suppress leakage current in the logic circuits $L_i$.

During the standby period specified by the system in the background art, since the signals SL and $\overline{SL}$ in the semiconductor integrated circuit always hold the potentials VDD and GND, respectively, the transistors Q1 and Q2 are off and the virtual power supply line VDDV and virtual grounding line GNDV are electrically disconnected from the actual power supply VDD and actual ground GND, respectively. Thus, the prolonged standby period specified by the system lowers the potential of the virtual power supply line VDDV and raises the potential of the virtual grounding line GNDV with time until the potential difference therebetween finally becomes very small, resulting in losses of potential information (logic) held by a latch, a register, a flip-flop, and the like.

In this preferred embodiment, however, during the standby period specified by the system, the signals SL and $\overline{SL}$ are intermittently set to active-period potentials, that is, the potentials GND and VDD, respectively, and the transistors Q1 and Q2 produce intermittent conduction between the actual power supply VDD and virtual power supply line VDDV and between the actual ground GND and virtual grounding line GNDV, respectively. This allows the decreasing potential of the virtual power supply line VDDV and increasing potential of the virtual grounding line GNDV to stop halfway and return to the original potentials during the standby period as shown in FIG. 1.

This means that electrical charge is fed to the parasitic capacitance $C_V$ on the virtual power supply line VDDV (charging) and electrical charge is emitted from the parasitic capacitance $C_G$ on the virtual grounding line GNDV (discharging). Thus, the virtual power supply line VDDV and virtual grounding line GNDV may feed electrical charge required for logic storage to the logic circuits $L_i$ comprised of the transistors LT having a large leakage current, particularly to the sequential circuits thereof.

Further, since the plurality of logic circuits $L_i$ are connected to the virtual power supply line VDDV and virtual grounding line GNDV, the intermittent charge supplement during the standby period requires only to function the transistors Q1 and Q2 as switches but need not be performed on each of the plurality of logic circuits $L_i$.

Therefore, the state of the logic circuit $L_i$ is returned to that for the active period after a prolonged standby period. Ease of use and performance are not deteriorated when a semiconductor integrated circuit is used which frequently repeats the active and standby conditions.

Second Preferred Embodiment

Figure 2:
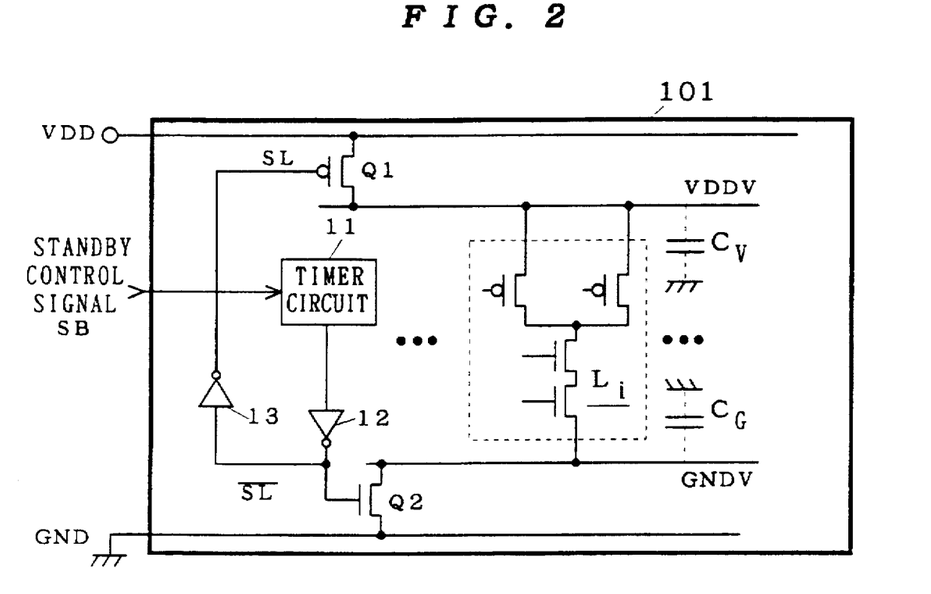
FIG. 2 is a circuit diagram of a second preferred embodiment according to the present invention.
Figure 2:
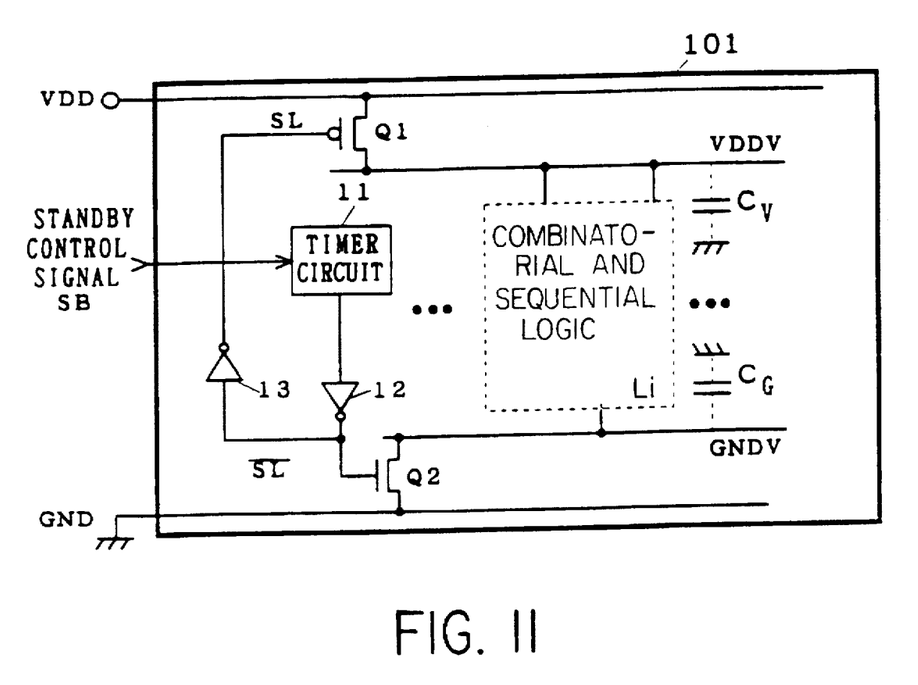

FIG. 2 is a circuit diagram of a second preferred embodiment according to the present invention. A semiconductor integrated circuit (chip) 101 is connected to the (actual) power supply VDD and the (actual) ground GND and receives a standby control signal SB from a system not shown.

The chip 101 comprises the virtual power supply line VDDV, the virtual grounding line GNDV, the transistors Q1 and Q2, and the logic circuits $L_i$ in the same manner as the first preferred embodiment to form the arrangement of FIG. 9. The chip 101 further comprises a timer circuit 11 and inverters 12 and 13.

The system instructs the chip 101 to set the standby period by using the standby control signal SB. Upon receipt of the standby control signal SB, the timer circuit 11 applies an initial high level (e.g., the potential VDD) to the inverter 12. The inverter 12 inverts the received signal logic to output the signal $\overline{SL}$ which is thus at the potential GND in the initial state. On the other hand, the inverter 13 inverts the received signal logic to output the signal SL which is thus at the potential VDD in the initial state. As described in the first preferred embodiment, the transistors Q1 and Q2 are off during the standby period.

The timer circuit 11 then starts clocking, and applies a low level (e.g., the potential GND) to the inverter 12 for a predetermined drive period after an elapse of a predetermined quiescent period. Thus, the inverter 12 outputs the signal $\overline{SL}$ at the potential VDD and the inverter 13 outputs the signal SL at the potential GND. This causes the transistors Q1 and Q2 to turn on to charge the virtual power supply line VDDV having a decreased potential up to the potential VDD and to discharge the virtual grounding line GNDV having an increased potential down to the potential GND.

After a lapse of the drive period, the timer circuit 11 returns to the initial state to output the high level again during the predetermined quiescent period. In this manner, intermittently bringing the chip 101 into the active state even during the standby period prevents the loss of logic of the sequential circuits of the logic circuits $L_i$.

The system instructs the chip 101 to set the active period again by using the standby control signal SB. Upon receipt of the standby control signal SB, the timer circuit 11 applies a constantly low level output to the inverter 12, and the signals SL and $\overline{SL}$ are at the potentials GND and VDD, respectively. Then the transistors Q1 and Q2 turn on, and the virtual power supply line VDDV and virtual grounding line GNDV function as low-impedance power supply line and grounding line, respectively, allowing high-speed circuit operation of the chip 101.

In the above stated operation, the timer circuit 11 may be quiescent when active or used to other purposes. The timer circuit 11 may be readily constructed by using a delay element.

As hereinabove described, the second preferred embodiment may embody the generation of the signals SL and $\overline{SL}$ for providing the effects of the first preferred embodiment.

Third Preferred Embodiment

Figure 3:
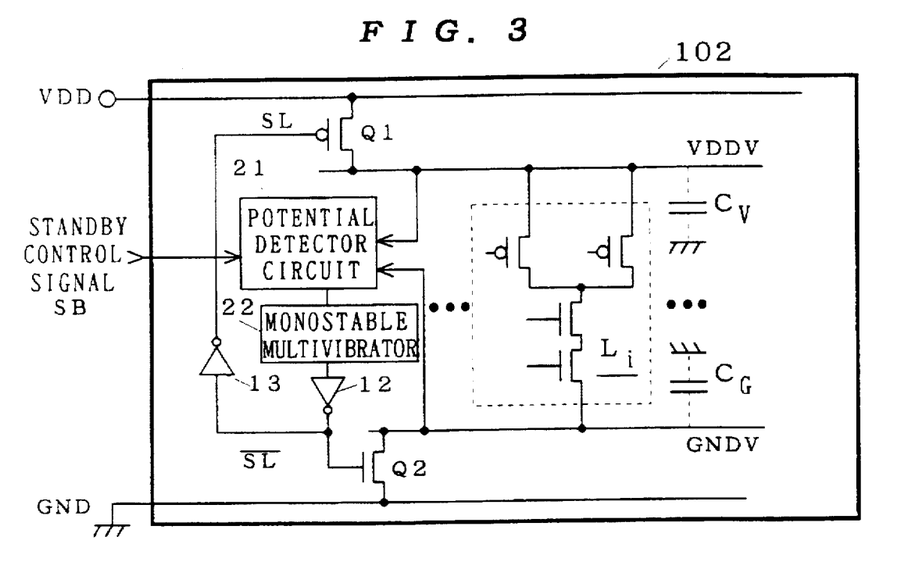
FIG. 3 is a circuit diagram of a third preferred embodiment according to the present invention.

FIG. 3 is a circuit diagram of a third preferred embodiment according to the present invention. A chip 102 is constructed such that the timer circuit 11 of the chip 101 described with reference to FIG. 2 in the second preferred embodiment is replaced with a potential detector circuit 21 and a monostable multivibrator 22.

The system for determining the timing of intermittently charging and discharging the virtual power supply line VDDV and virtual grounding line GNDV during the standby period by the timer circuit 11 as in the second preferred embodiment is advantageous in simple circuit arrangement. However, to previously setting the timing by the timer circuit 11, consideration must be given to allowance for operation of the semiconductor integrated circuit due to variations in operating conditions such as voltage and temperature and variations in chip fabricating conditions.

More specifically, consideration must be given to the lowest level of the decreasing potential of the virtual power supply line VDDV and the highest level of the increasing potential of the virtual grounding line GND which can hold logic stored in the latch, register, and flip-flop of the logic circuits $L_j$. Such consideration must be given for each of all logic circuits $L_j$. In addition, since the virtual power supply line VDDV and virtual grounding line GNDV supply electrical charge to all of the logic circuits $L_j$, intermittently charging and discharging the virtual power supply line VDDV and virtual grounding line GNDV must be associated with the logic circuit which is under the worst condition.

The intermittent charging and discharging associated with the logic circuit which is under the worst condition are unnecessarily frequently performed on a number of other logic circuits. This adds to power consumption during the standby period because of the power required for charging and discharging.

In the third preferred embodiment, however, the potential detector circuit 21 detects the potential of the virtual power supply line VDDV and the potential of the virtual grounding line GNDV to monitor the potential difference $\Delta V$ therebetween, providing the optimum timing of the intermittent charging and discharging.

Figure 4:
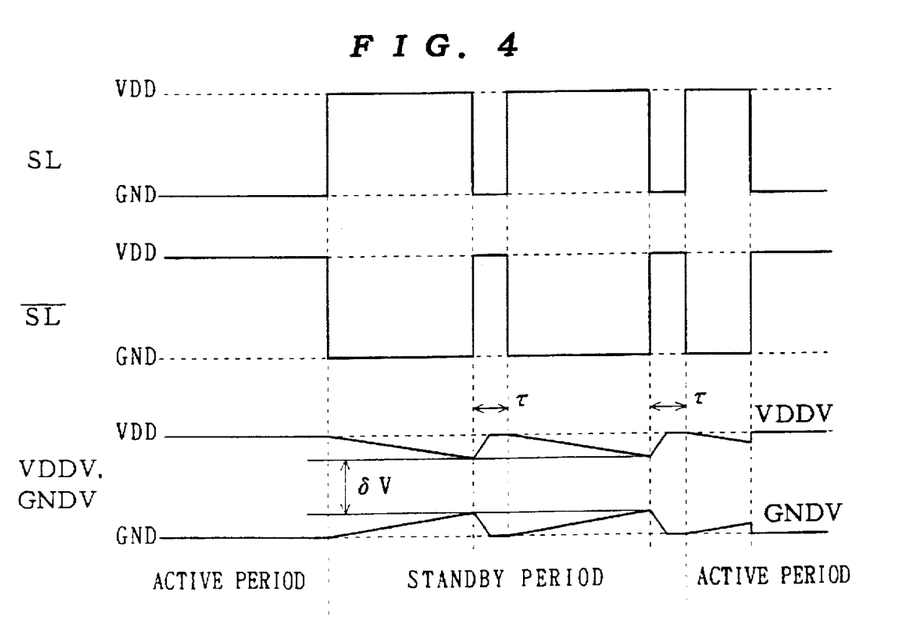
FIG. 4 is a waveform chart illustrating operation timing of the third preferred embodiment according to the present invention.

FIG. 4 is a waveform chart illustrating operation timing of the third preferred embodiment according to the present invention. The operation of the chip 102 is detailed below with reference to FIGS. 3 and 4. When the system not shown instructs the chip 102 to set the standby period by using the standby control signal SB, the potential detector circuit 21 is activated. Immediately after the entrance to the standby state, the potential difference $\Delta V$ equals (VDD–GND).

With the potential difference $\Delta V$ greater than a predetermined minimum value $\delta V$ (<VDD–GND), the potential detector circuit 21 outputs a high level (e.g., the potential VDD) and the monostable multivibrator 22 outputs a high level (e.g., the potential VDD) in a stable condition. Thus, the signals SL and $\overline{SL}$ are at the potentials VDD and GND, respectively, and the transistors Q1 and Q2 remain non-conducting.

When the potential difference AV is not greater than the minimum value $\delta V$, the potential detector circuit 21 outputs a low level (e.g., the potential GND). In response to the falling edge of the output from the potential detector circuit 21, the monostable multivibrator 22 outputs a low level (e.g., the potential GND) which is unstable over a predetermined time period $\tau$. This causes the signals SL and $\overline{SL}$ to have the ground potential GND and the power supply potential VDD, respectively, and the transistors Q1 and Q2 are brought into conduction. The virtual grounding line GNDV is discharged down to the ground potential GND, and the virtual power supply line VDDV is charged up to the power supply potential VDD. The predetermined time period $\tau$ is set to the length sufficient for the charging and discharging.

If the potential difference $\Delta V$ is not greater than the minimum value $\delta V$ so long as the standby period continues, the output from the potential detector circuit 21 falls again and the virtual grounding line GNDV and virtual power supply line VDDV are intermittently charged and discharged for the predetermined time period $\tau$.

The minimum value $\delta V$ is substantially set by detecting the logic of a dummy logic circuit which, in order to hold logic, requires a voltage slightly higher than the voltage required to hold the logic of one of the latches, registers and flip-flops of the logic circuits $L_j$ which is most affected by the decrease in potential difference $\Delta V$ in the standby state.

More specifically, the potential detector circuit 21 having the dummy logic circuit which is applied the potential difference $\Delta V$ to output the low level when the logic of the dummy logic circuit cannot be held.

The system instructs the chip 102 to set the active period again by using the standby control signal SB. In response to the standby signal SB, the potential detector circuit 21 is inactivated to stop its function. The monostable multivibrator 22 applies the constantly low level output to the inverter 12 when the potential detector circuit 21 is inactive, and is controlled to turn on the transistors Q1 and Q2. Such control is achieved by the techniques well know in the art.

The third preferred embodiment as above stated is adapted to monitor the potential difference $\Delta V$ between the virtual power supply line VDDV and the virtual grounding line GNDV within the chip 102 to intermittently charge and discharge the virtual power supply line VDDV and virtual grounding line GNDV before the potential difference reaches the value at which the logic stored in the sequential circuit such as the latch, register and flip-flop is no longer held. This allows extension of the time intervals of the intermittent charging and discharging during the standby period to the limit specified by the operating conditions and the allowance of operation inherent to the chip, thereby greatly reducing the power consumption during the standby period.

Fourth Preferred Embodiment

As the size of the logic circuits within the semiconductor integrated circuit chip increases, the load capacitance of the virtual power supply line and virtual grounding line increases until power consumption is not negligible in spite of the intermittent charging and discharging during the standby period.

The logic circuits include a combinational circuit whose output is determined only by the state of a currently applied signal, and a sequential circuit whose output is not determined without the consideration of the previous state thereof. The combinational circuit need not store the signal state therein.

Figure 5:
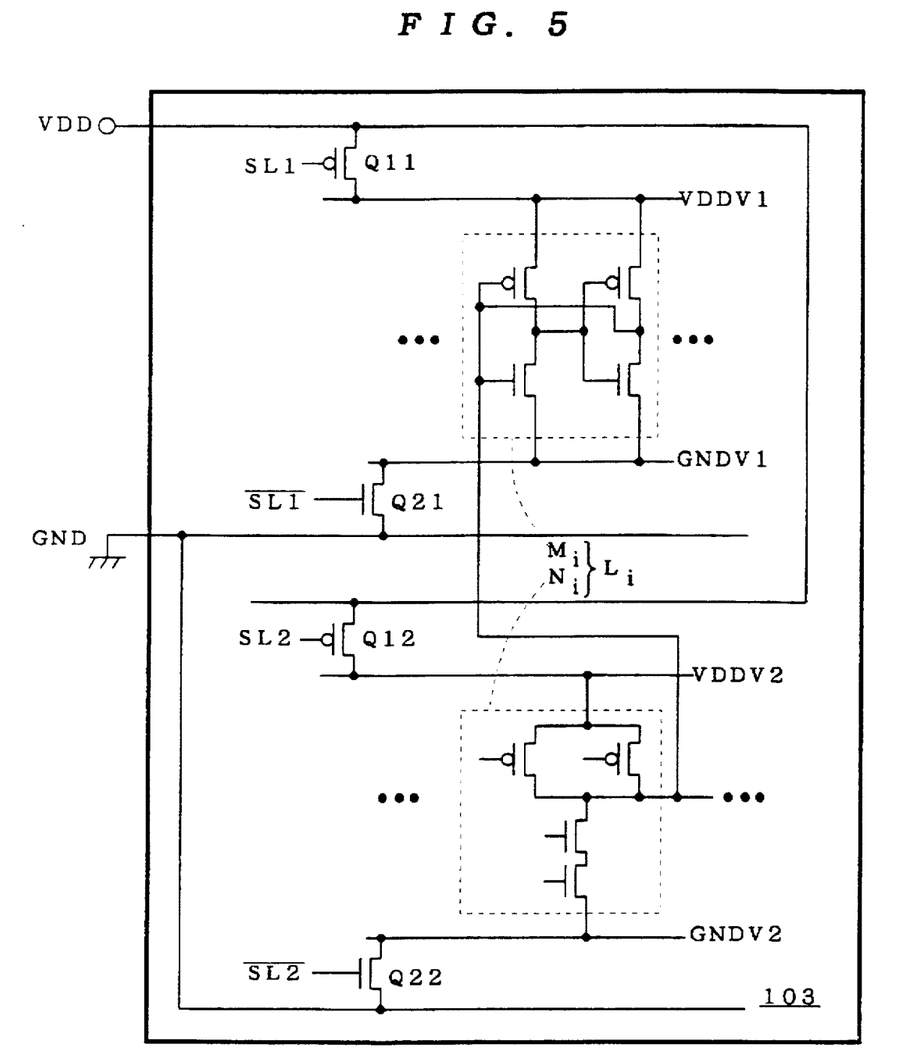
FIG. 5 is a circuit diagram of a fourth preferred embodiment according to the present invention.

In the fourth preferred embodiment, there are provided two pairs of virtual power supply lines and virtual grounding lines, one pair being used for the combinational circuit and the other for the sequential circuit. Only the virtual power supply line and virtual grounding line for the sequential circuit required to store the signal state therein are intermittently charged and discharged.

Figure 6:
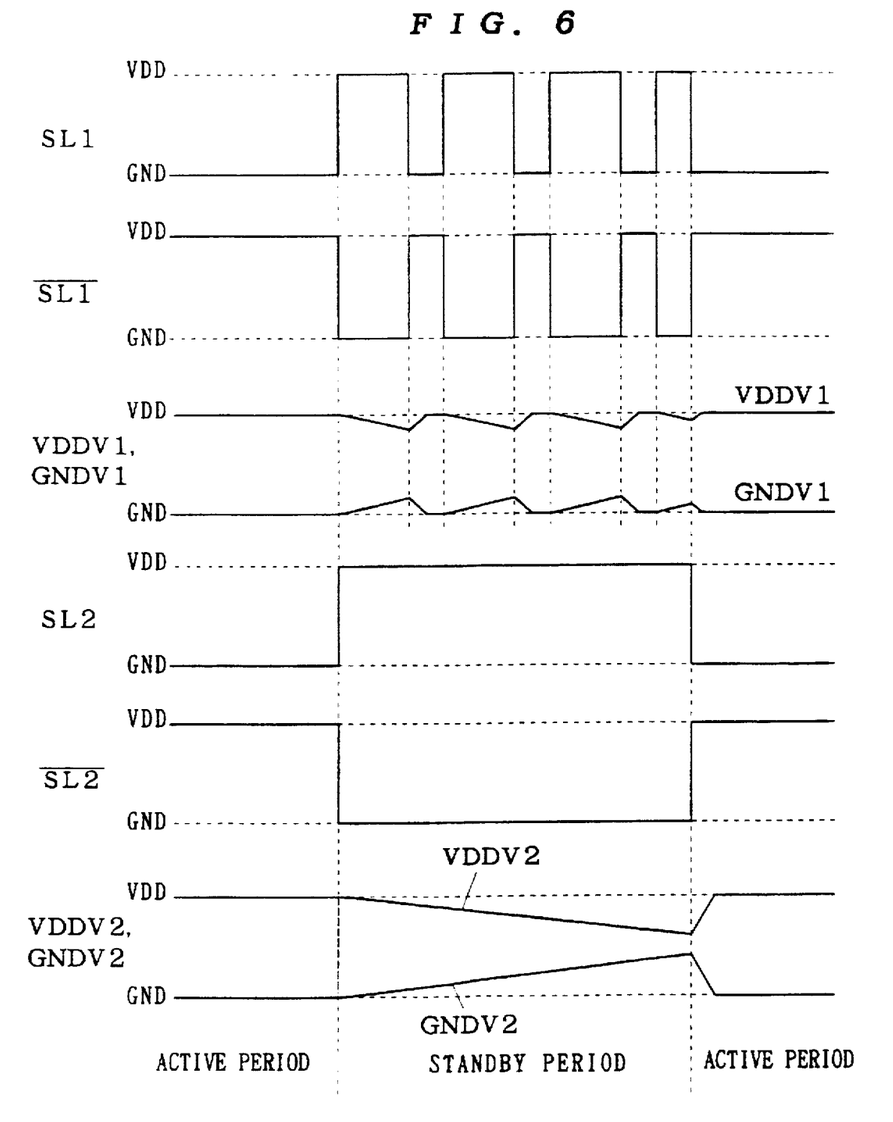
FIG. 6 is a waveform chart illustrating operation timing of the fourth preferred embodiment according to the present invention.

FIG. 5 is a circuit diagram of the fourth preferred embodiment according to the present invention. FIG. 6 is a waveform chart illustrating operation timing of the fourth preferred embodiment.

A chip 103 is connected to the (actual) power supply VDD and the (actual) ground GND. A virtual power supply line VDDV1 is connected to the power supply VDD through a PMOS transistor Q11, and a virtual power supply line VDDV2 is connected to the power supply VDD through a PMOS transistor Q12. A virtual grounding line GNDV1 is connected to the ground GND through an NMOS transistor Q21, and a virtual grounding line GNDV2 is connected to the ground GND through an NMOS transistor Q22. High threshold transistors HT are used as the transistors Q11, Q12, Q21, Q22.

A plurality of sequential circuits $M_i$ (i=1, 2, . . . ) are connected between the virtual power supply line VDDV1 and virtual grounding line GNDV1, and a plurality of combinational circuits $N_i$ (i=1, 2, . . . ) are connected between the virtual power supply line VDDV2 and virtual grounding line GNDV2. The sequential circuits $M_i$ and the combinational circuits $N_i$ form the logic circuits $L_i$, respectively. In other words, each logic circuit $L_i$ is essentially comprised of two portions: the sequential circuit $M_i$ which receives power from the virtual power supply line VDDV1 and virtual grounding line GNDV1, and the combinational circuit $N_i$ which receives power from the virtual power supply line VDDV2 and virtual grounding line GNDV2. As described above, low threshold transistors LT are used as the logic circuits $L_i$.

Signals SL1, $\overline{SL1}$, SL2, $\overline{SL2}$ are applied to the gates of the transistors Q11, Q12, Q21, Q22, respectively. The relation between variations in the signals SL1, $\overline{SL1}$, SL2, $\overline{SL2}$ and variations in the virtual power supply lines VDDV1, VDDV2 and virtual grounding lines GNDV1, GNDV2 is shown in FIG. 6. The waveforms of the signals SL1 and $\overline{SL1}$, virtual power supply line VDDV1, and virtual grounding line GNDV1 are similar to those of the signals SL and $\overline{SL}$ virtual power supply line VDDV, and virtual grounding line GNDV of FIG. 1, respectively. The waveforms of the signals SL2 and $\overline{SL2}$, virtual power supply line VDDV2, and virtual grounding line GNDV2 are similar to those of the signals SL and $\overline{SL}$, virtual power supply line VDDV, and virtual grounding line GNDV of FIG. 10, respectively.

Thus, the state of the sequential circuits $M_i$ may be returned to that for the active period after a prolonged standby period in a similar manner to the first preferred embodiment. On the other hand, the intermittent charging and discharging of the virtual power supply line VDDV2 and virtual grounding line GNDV2 are not performed during the standby period in the combinational circuits $N_i$.

This allows further reduction in power consumption and the return of the state of the logic circuits $L_i$ to that for the active period after the prolonged standby period.

Fifth Preferred Embodiment

Figure 7:
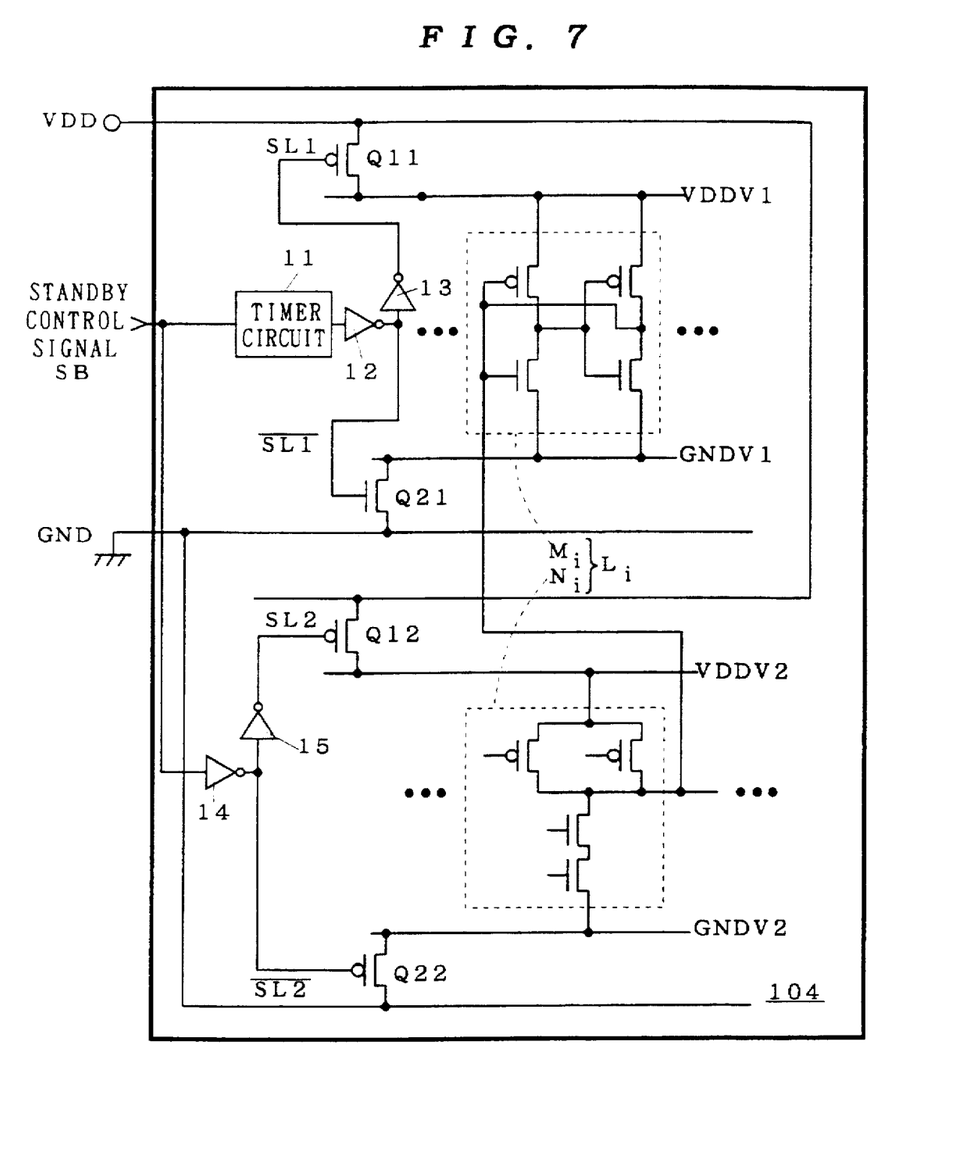
FIG. 7 is a circuit diagram of a fifth preferred embodiment according to the present invention.

FIG. 7 is a circuit diagram of a fifth preferred embodiment according to the present invention. A chip 104 comprises the timer circuit 11 and inverters 12 to 15 in addition to the components of the chip 103 of the fourth preferred embodiment shown in FIG. 5.

The timer circuit 11 receives the standby control signal SB from the exterior of the chip 104. The inverter 12 inverts the output from the timer circuit 11 to output the signal $\overline{SL1}$. The inverter 13 inverts the output from the inverter 12 to output the signal SL1. The inverter 14 inverts the standby control signal SB to output the signal $\overline{SL2}$. The inverter 15 inverts the output from the inverter 14 to output the signal SL2.

The standby control signal SB is at the low level (e.g., the ground potential GND) during the active period. Then, the timer circuit 11 is inactive and outputs the low level. Thus, the signals SL1, $\overline{SL1}$, SL2, $\overline{SL2}$ are low, high (e.g., at the power supply potential VDD), low, high, respectively, and all of the transistors Q11, Q12, Q21, Q22 are conducting. Such a state is shown in FIG. 6. The virtual power supply lines VDDV1 and VDDV2 are at the power supply potential VDD, and the virtual grounding lines GNDV1 and GNDV2 are at the ground potential GND.

To instruct the chip 104 to set the standby period, the standby control signal SB is at the high level and the timer circuit 11 is activated. Similarly to the second preferred embodiment, the timer circuit 11 outputs the high level for the predetermined quiescent period and then outputs the low level for the predetermined drive period. This turns off the transistors Q11 and Q21 for the quiescent period and turns on the transistors Q11 and Q21 for the drive period. The on-off operation of the transistors Q11, Q21 is periodically performed so long as the standby period continues. The virtual power supply line and virtual grounding line are spontaneously intermittently charged and discharged within the chip 104 for the sequential circuits $M_i$ required to hold information (state) during the standby period.

For the combinational circuits $N_i$ which are not required to hold information, the signal $\overline{SL2}$ which is the inverted logic of the standby control signal SB has the low level to turn off the transistor Q22, and the signal SL2 has the high level to turn off the transistor Q12. Thus, the virtual power supply line VDDV2 and virtual grounding line GNDV2 are insulated from the power supply VDD and ground GND, respectively. This state continues until the system gives the instruction to terminate the standby period by using the standby control signal SB.

The fifth preferred embodiment as above stated is adapted to spontaneously intermittently charge and discharge the virtual power supply line and virtual grounding line by the timer circuit contained in the chip for the sequential circuits required to hold information during the standby period, and to insulate the virtual power supply line and virtual grounding line from the power supply line and grounding line, respectively, over the standby period for the combinational circuits which are not required to hold information. This achieves reduction in power consumption during the standby period and information retention within the circuit.

Sixth Preferred Embodiment

Figure 8:
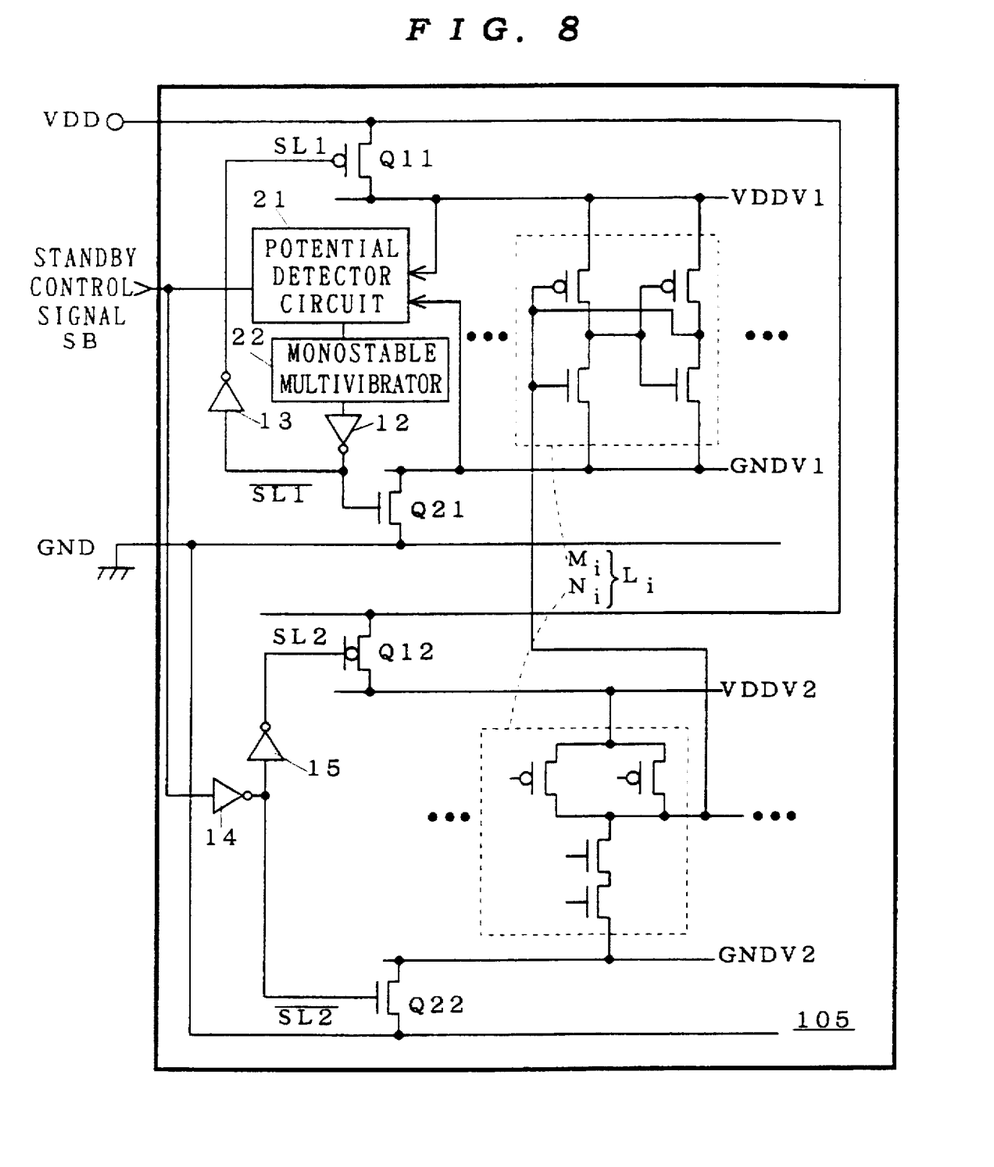
FIG. 8 is a circuit diagram of a sixth preferred embodiment according to the present invention.

FIG. 8 is a circuit diagram of a sixth preferred embodiment according to the present invention. A chip 105 is constructed such that the timer circuit 11 of the chip 104 described in the fifth preferred embodiment shown in FIG. 7 is replaced with the potential detector circuit 21 and monostable multivibrator 22. The operation of the potential detector circuit 21 and monostable multivibrator 22 is similar to that of the third preferred embodiment. The potential detector circuit 21 detects the potentials of the virtual power supply line VDDV1 and virtual grounding line GNDV1 to provide the potential difference $\Delta V$ therebetween.

The potential difference between the virtual power supply line VDDV1 and virtual grounding line GNDV1 becomes smaller with time during the standby period. When the potential difference is not more than the minimum value $\delta V$ at which the logic stored in the latch, register and flip-flop cannot be held, the potential detector circuit 21 outputs the low level. Then the signal SL1 has the ground potential GND, and the signal $\overline{SL1}$ has the power supply potential VDD. Thus, the virtual power supply line VDDV1 for the sequential circuits is charged up to the power supply potential VDD, and the virtual grounding line GNDV1 for the sequential circuits is discharged down to the ground potential GND. For the sequential circuits $M_i$ required to hold information, the spontaneous intermittent charging and discharging are performed within the chip 105 during the standby period.

For the combinational circuits $N_i$ which are not required to hold information, on the other hand, the virtual power supply line VDDV2 and virtual grounding line GNDV2 are insulated from the power supply VDD and ground GND, respectively, in the same manner as in the fifth preferred embodiment.

The sixth preferred embodiment as above stated is adapted such that, for the sequential circuits required to hold information, the charging and discharging are performed during the standby period when the potential detector circuit 21 within the chip 105 detects the potential difference $\Delta V$ which is less than the minimum value $\delta V$ and adapted such that, for the combinational circuits which are not required to hold information, the virtual power supply line VDDV2 and virtual grounding line GNDV2 are insulated from the power supply VDD and ground GND, respectively, over the standby period. This achieves optimum information retention within the circuit and optimum low power consumption during the standby period against the factors of variations inherent to the chip 105.

While the invention has been described in detail, the foregoing description is in all aspects illustrative and not restrictive. It is understood that numerous other modifications and variations can be devised without departing from the scope of the invention.

We claim:

1. A semiconductor integrated circuit comprising:
   a first power supply;
   a first power supply line;
   a first switch having a first end connected to said first power supply, and a second end connected to said first power supply line; and
   at least one logic circuit including a sequential circuit connected to said second end of said first switch through said first power supply line, wherein said first switch is constantly conducting during a first period over which said logic circuit is active, and said first switch is intermittently conducting during a second period over which said logic circuit is on standby.

2. The semiconductor integrated circuit of claim 1, wherein said at least one logic circuit includes a plurality of logic circuits.

3. The semiconductor integrated circuit of claim 2, further comprising:
a timer for generating a control signal for controlling conduction of said first switch during said second period.

4. The semiconductor integrated circuit of claim 2, further comprising:
a potential detector circuit for detecting a first potential which is the potential of said first power supply line, said potential detector circuit bringing said first switch into conduction when said first potential falls outside a predetermined range during said second period.

5. The semiconductor integrated circuit of claim 1, further comprising:
a second power supply;
a second power supply line;
a second switch having a first end connected to said second power supply, and a second end connected to said second power supply line; and
said sequential circuit being connected to said second end of said second switch through said second power supply line,
wherein conduction/non-conduction of said second switch coincides with conduction/non-conduction of said first switch.

6. The semiconductor integrated circuit of claim 2, further comprising:
a second power supply;
a second power supply line;
a second switch having a first end connected to said second power supply, and a second end connected to said second power supply line; and
said sequential circuit being connected to said second end of said second switch through said second power supply line,
wherein conduction/non-conduction of said second switch coincides with conduction/non-conduction of said first switch.

7. The semiconductor integrated circuit of claim 3, further comprising:
a second power supply;
a second power supply line;
a second switch having a first end connected to said second power supply, and a second end connected to said second power supply line; and
said sequential circuit being connected to said second end of said second switch through said second power supply line,
wherein conduction/non-conduction of said second switch coincides with conduction/non-conduction of said first switch.

8. The semiconductor integrated circuit of claim 4, further comprising:
a second power supply;
a second power supply line;
a second switch having a first end connected to said second power supply, and a second end connected to said second power supply line; and
said sequential circuit being connected to said second end of said second switch through said second power supply line,
wherein conduction/non-conduction of said second switch coincides with conduction/non-conduction of said first switch.

9. The semiconductor integrated circuit of claim 1, wherein said logic circuit further includes a combinational circuit,
said semiconductor integrated circuit further comprising
a second switch having a first end connected to said first power supply, and
a second end connected to said combinational circuit,
wherein said second switch is constantly conducting during said first period, and said second switch is constantly non-conducting during said second period.

10. The semiconductor integrated circuit of claim 2, wherein said logic circuit further includes a combinational circuit,
said semiconductor integrated circuit further comprising
a second switch having a first end connected to said first power supply, and a second end connected to said combinational circuit,
wherein said second switch is constantly conducting during said first period, and said second switch is constantly non-conducting during said second period.

11. The semiconductor integrated circuit of claim 3, wherein said logic circuit further includes a combinational circuit,
said semiconductor integrated circuit further comprising
a second switch having a first end connected to said first power supply, and a second end connected to said combinational circuit,
wherein said second switch is constantly conducting during said first period, and said second switch is constantly non-conducting during said second period.

12. The semiconductor integrated circuit of claim 4, wherein said logic circuit further includes a combinational circuit,
said semiconductor integrated circuit further comprising
a second switch having a first end connected to said first power supply, and a second end connected to said combinational circuit,
wherein said second switch is constantly conducting during said first period, and said second switch is constantly non-conducting during said second period.

13. The semiconductor integrated circuit of claim 9, further comprising:
a second power supply;
a second power supply line;
a third switch having a first end connected to said second power supply, and a second end connected to said second power supply line;
a fourth switch having a first end connected to said second power supply, and a second end;
said sequential circuit being connected to said second end of said third switch through said second power supply line; and
said combinational circuit being further connected to said second end of said fourth switch,
wherein conduction/non-conduction of said third switch coincides with conduction/non-conduction of said first switch, and wherein conduction/non-conduction of said fourth switch coincides with conduction/non-conduction of said second switch.

14. The semiconductor integrated circuit of claim 10, further comprising:
   a second power supply;
   a second power supply line;
   a third switch having a first end connected to said second power supply, and a second end connected to said second power supply line;
   a fourth switch having a first end connected to said second power supply, and a second end;
   said sequential circuit being connected to said second end of said third switch through said second power supply line; and
   said combinational circuit being further connected to said second end of said fourth switch,
   wherein conduction/non-conduction of said third switch coincides with conduction/non-conduction of said first switch, and
   wherein conduction/non-conduction of said fourth switch coincides with conduction/non-conduction of said second switch.

15. The semiconductor integrated circuit of claim 11, further comprising:
   a second power supply;
   a second power supply line for functioning to hold electrical charge;
   a third switch having a first end connected to said second power supply, and a second end connected to said second power supply line;
   a fourth switch having a first end connected to said second power supply, and a second end;
   said sequential circuit being connected to said second end of said third switch through said second power supply line; and
   said combinational circuit being further connected to said second end of said fourth switch,
   wherein conduction/non-conduction of said third switch coincides with conduction/non-conduction of said first switch, and
   wherein conduction/non-conduction of said fourth switch coincides with conduction/non-conduction of said second switch.

16. The semiconductor integrated circuit of claim 12, further comprising:
   a second power supply;
   a second power supply line;
   a third switch having a first end connected to said second power supply, and a second end connected to said second power supply line;
   a fourth switch having a first end connected to said second power supply, and a second end;
   said sequential circuit being connected to said second end of said third switch through said second power supply line; and
   said combinational circuit being further connected to said second end of said fourth switch,
   wherein conduction/non-conduction of said third switch coincides with conduction/non-conduction of said first switch, and
   wherein conduction/non-conduction of said fourth switch coincides with conduction/non-conduction of said second switch.

17. A semiconductor integrated circuit comprising:
   a power supply for providing predetermined potential;
   a power supply line; and
   a logic circuit including a sequential circuit, said sequential circuit being constantly connected to said power supply through said power supply line during a first period, said sequential circuit being intermittently connected to said power supply through said power supply line during a second period;
   wherein said logic circuit is in an active state in which it performs logic processing during said first period, and said logic circuit is in a standby state that temporarily stops the logic precessing during said second period.

18. The semiconductor integrated circuit of claim 17, wherein said logic circuit further includes a combinational circuit,
   said combinational circuit being constantly connected to said power supply during said first period, said combinational circuit being constantly disconnected from said power supply during said second period.

19. The semiconductor integrated circuit according to claim 17, further comprising:
   a switch for connecting said power supply line to said power supply; and
   a control device for constantly connecting said power supply to said power supply line during said first period which is an active period in which said logic circuit performs logic processing, and intermittently connecting said power supply to said power supply line during said second period which is a standby period during which said logic circuit does not perform logic processing and an electrical charge held by a parasitic capacitance on said power supply line is sufficient to maintain a state of said sequential circuit.

20. The semiconductor integrated circuit according to claim 17, further comprising:
   a switch for connecting said power supply line to said power supply; and
   a control device for constantly connecting said power supply to said power supply line during said first period, and intermittently connecting said power supply to said power supply line during said second period;
   wherein said sequential circuit is connected to said power supply through said power supply line during said second period when a voltage differential of said electrical charge between said power supply line and a reference ground erodes to a predetermined value, and
   said power supply remains connected for a predetermined time period, thereby re-establishing said voltage differential of said electrical charge.

21. The semiconductor integrated circuit according to claim 19, wherein said control device includes:
   an input that receives a signal indicating said standby period of said logic circuit; and
   a timer for connecting said power supply to said power supply line by detecting a predetermined time period since a start of said standby period based on said signal.

22. The semiconductor integrated circuit according to claim 19, wherein said control device includes a potential detector for connecting said power supply to said power supply line when a potential difference between said power supply line and a reference line is outside a predetermined range.

* * * * *